(12) United States Patent
Richard et al.

(10) Patent No.: US 11,926,349 B2
(45) Date of Patent: Mar. 12, 2024

(54) VEHICLE FOR AN ELECTRICAL LINE

(71) Applicant: HYDRO-QUÉBEC, Montréal (CA)

(72) Inventors: Pierre-Luc Richard, Longueuil (CA); François Morin, Carignan (CA); Nicolas Pouliot, Montréal (CA)

(73) Assignee: HYDRO-QUÉBEC, Montreal (CA)

( * ) Notice: Subject to any disclaimer, the term of this patent is extended or adjusted under 35 U.S.C. 154(b) by 969 days.

(21) Appl. No.: 16/764,367

(22) PCT Filed: Nov. 16, 2018

(86) PCT No.: PCT/CA2018/051462
§ 371 (c)(1),
(2) Date: Jul. 7, 2020

(87) PCT Pub. No.: WO2019/095071
PCT Pub. Date: May 23, 2019

(65) Prior Publication Data
US 2020/0331502 A1    Oct. 22, 2020

Related U.S. Application Data

(60) Provisional application No. 62/587,077, filed on Nov. 16, 2017.

(51) Int. Cl.
*B61B 3/02* (2006.01)
*H02G 1/02* (2006.01)
*G01R 31/08* (2020.01)

(52) U.S. Cl.
CPC ............... *B61B 3/02* (2013.01); *H02G 1/02* (2013.01); *G01R 31/085* (2013.01)

(58) Field of Classification Search
CPC .... B61B 3/02; B61B 7/00; B61B 7/06; H02G 1/02
See application file for complete search history.

(56) References Cited

U.S. PATENT DOCUMENTS 6,494,141 B2    12/2002    Montambault et al.
7,634,966 B2 *  12/2009    Pouliot .................... H02G 1/02
                                                                104/112
(Continued)

FOREIGN PATENT DOCUMENTS

CA    2418473    8/2004
CA    2514440    8/2004

OTHER PUBLICATIONS

HiBot—Expliner: Power Line Inspection Robot, YouTube Video: https://www.youtube.com/watch?v=tcakf1LcOe0.

*Primary Examiner* — Robert J McCarry, Jr.
(74) *Attorney, Agent, or Firm* — NORTON ROSE FULBRIGHT CANADA LLP

(57) ABSTRACT

The invention relates to a vehicle displaceable along aerial conductors of an electricity transmission line. The vehicle includes a body having arms. Each arm has a first end pivotably mounted to the body and a second distal end. A motorized wheel is mounted to each arm to engage one of the conductors to displace the vehicle. Support rotors have at least two blades. Each blade has an arm portion extending from the support rotor and a contact portion extending from the arm portion to engage one of the conductors to temporarily support the vehicle. An arm displacement mechanism engages the arms, and is operable to displace the arms in a direction transverse to a direction of travel of the vehicle to move the arms together and apart.

25 Claims, 5 Drawing Sheets

(56) References Cited

U.S. PATENT DOCUMENTS

| | | |
|---|---|---|
| 8,505,461 B2 | 8/2013 | Phillips et al. |
| 8,660,698 B2 | 2/2014 | Phillips et al. |

* cited by examiner

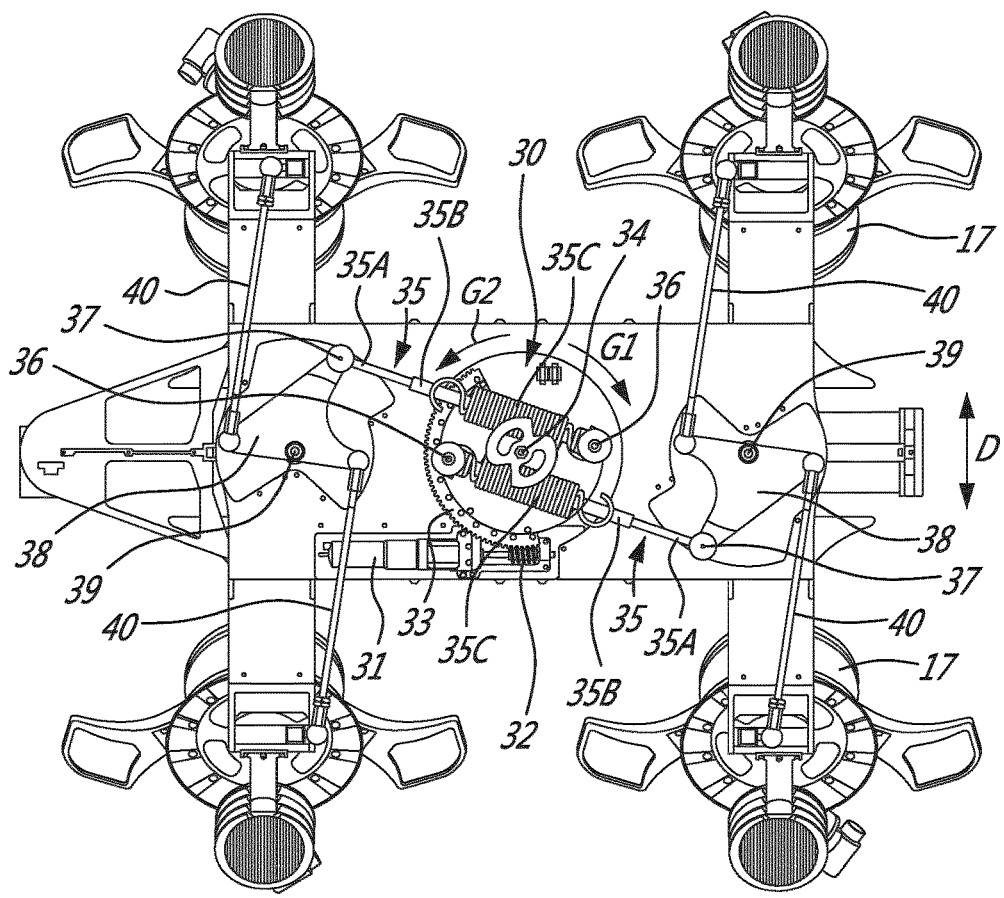
FIG_4A
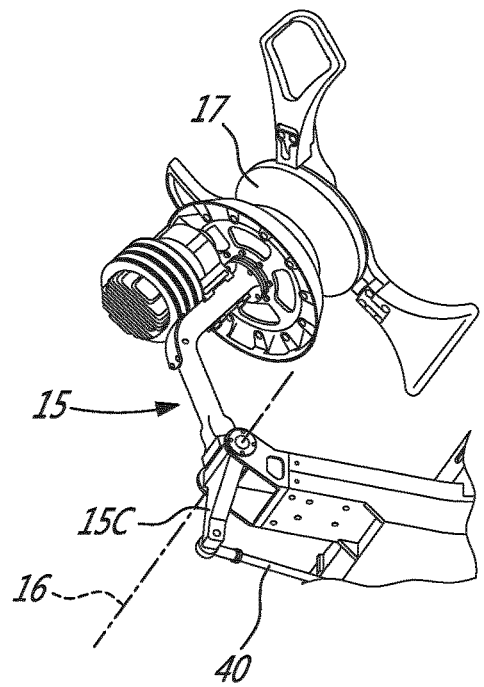
FIG_4B

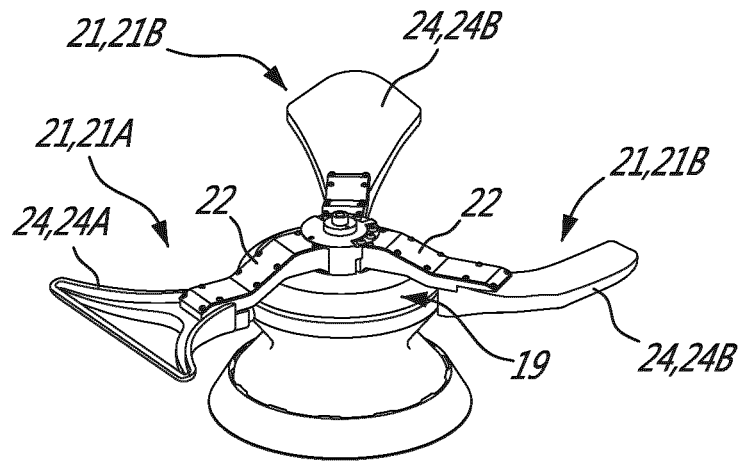
FIG. 5A
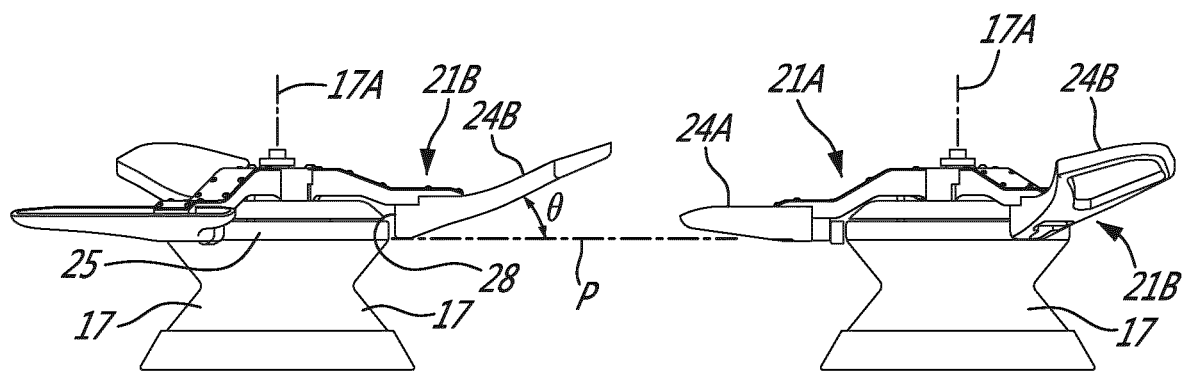
FIG. 5B
FIG. 5C
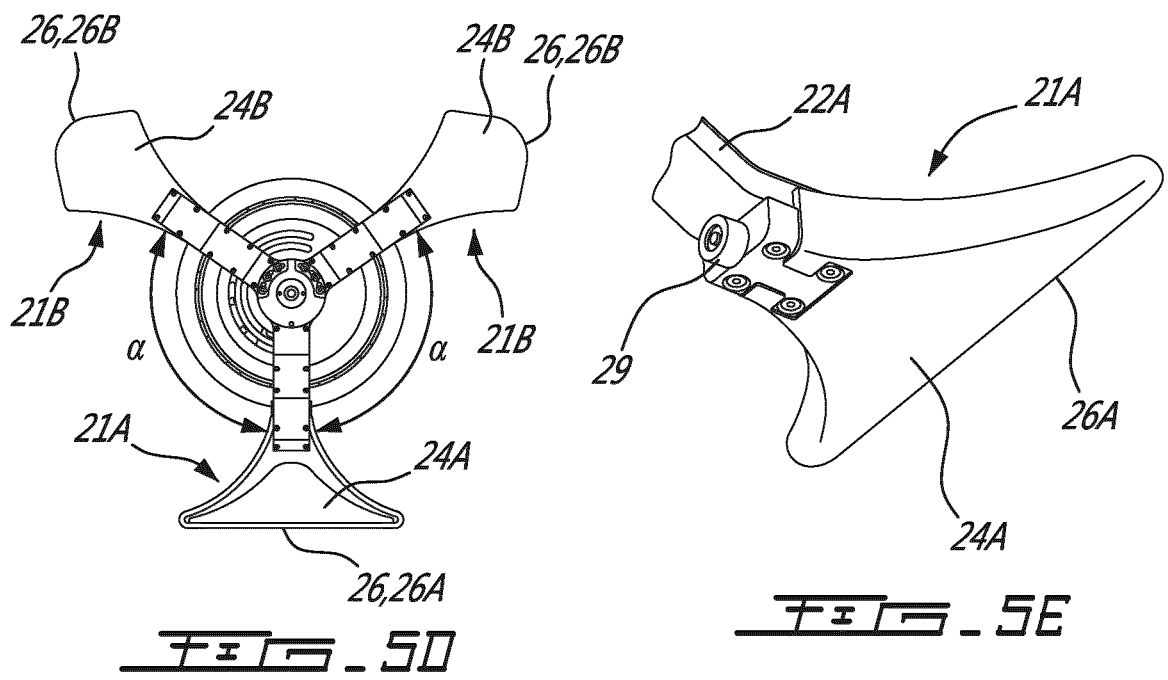
FIG. 5D
FIG. 5E

VEHICLE FOR AN ELECTRICAL LINE

CROSS-REFERENCE TO RELATED APPLICATIONS

This patent application is national stage application pursuant to 35 U.S.C. 371 of PCT patent application PCT/CA2018/051462 filed Nov. 16, 2018, which claims priority to provisional patent application having serial number U.S. 62/587,077 and filed Nov. 16, 2017, the entire contents of each of which are incorporated by reference herein.

TECHNICAL FIELD

The application relates generally to electrical power lines and, more particularly, to a vehicle for monitoring components of same.

BACKGROUND

It is sometimes necessary to inspect or monitor the components of aerial electric power lines. For some power lines, these components are often disposed very high above the ground, making them difficult to access. One technique for accessing the remote component involves raising a human technician from the ground or having the technician scale a neighbouring structure in proximity to the component. This presents inherent hazards for the technician, and often requires that the power line be shut off.

Another technique involves sending a robot along the power line. The robot may be unable to pass over obstacles that are located on the line, such as vibration dampers, and even less to change spans by passing over the elements which hold the conductor to each pylon.

The robot may therefore be restricted to intervene only between two pylons, or it must be removed and then reinstalled on the other side of the pylon by a human operator.

SUMMARY

There is disclosed a vehicle displaceable along aerial conductors of an electricity transmission line, the vehicle comprising: a body having at least one pair of arms, the arms of the at least one pair of arms being mounted on opposite sides of the body and extending away therefrom, each arm having a first end pivotably mounted to the body and a second distal end, a motorized wheel being mounted to the distal end of each arm, each wheel being engageable with one of the conductors to displace the vehicle therealong; a plurality of support rotors each mounted with one of the wheels and provided with at least two blades, each blade having an arm portion extending from the support rotor and being rotatable therewith, and a contact portion extending from the arm portion to engage one of the conductors to temporarily support the vehicle with the contact portion, the at least two blades including an impact blade and at least one transition blade; and an arm displacement mechanism mounted to the body and engaged with the arms, the arm displacement mechanism operable to displace the arms of the at least one pair of arms in a direction transverse to a direction of travel of the vehicle to move the opposed arms of the at least one pair of arms together, and to move the opposed arms of the at least one pair of arms apart.

There is disclosed a method for displacing a vehicle along aerial conductors of an electricity transmission line, the method comprising: rotating at least two wheels each in contact with one of the aerial conductors to induce movement of a body of the vehicle along the aerial conductors, each of the at least two wheels mounted at a distal end of an arm mounted at its other end to the body of the vehicle; applying a force on the arms in a direction transverse to a direction of movement of the vehicle along the aerial conductors to displace the arms toward each other; and when one of the at least two wheels encounter an obstacle of the aerial conductor, advance the vehicle in a direction of the obstacle to: contact the obstacle with an impact blade of a support rotor mounted to one of the at least two wheels; and rotate the support rotor about the obstacle with the impact blade by advancing the vehicle, so as to temporarily distance one of the at least two wheels from the aerial conductor, advancement of the vehicle along the aerial conductors after the obstacle causing one of the at least two wheels to reengage the aerial conductor.

There is disclosed a method of installing a vehicle on aerial conductors, comprising: receiving two aerial conductors between at least two motorized wheels mounted to distal ends of arms of at least one pair of arms, the arms of the at least one pair pivotably mounted at proximal ends to a body of the vehicle; pivoting the arms of the at least one pair of arms toward each other until the at least two motorized wheels contact the aerial conductors to support a weight of the vehicle from the aerial conductors with the motorized wheels.

DESCRIPTION OF THE DRAWINGS

Reference is now made to the accompanying figures in which:

FIG. 4A is a schematic perspective view of the portion of a body of the vehicle of FIG. 3 showing an arm displacement mechanism.

FIG. 4B is an enlarged view of one of the arms of the vehicle shown in FIG. 4A.

FIG. 5A is a perspective view of a wheel and a support rotor of the vehicle of FIG. 1A.

FIG. 5B is a side view of the wheel and support rotor shown in FIG. 5A.

FIG. 5C is another side view of the wheel and support rotor shown in FIG. 5A.

FIG. 5D is a top view of the wheel and support rotor shown in FIG. 5A.

FIG. 5E is an enlarged view of an impact blade of the support rotor shown in FIG. 5A.

DETAILED DESCRIPTION

Figure 1A:
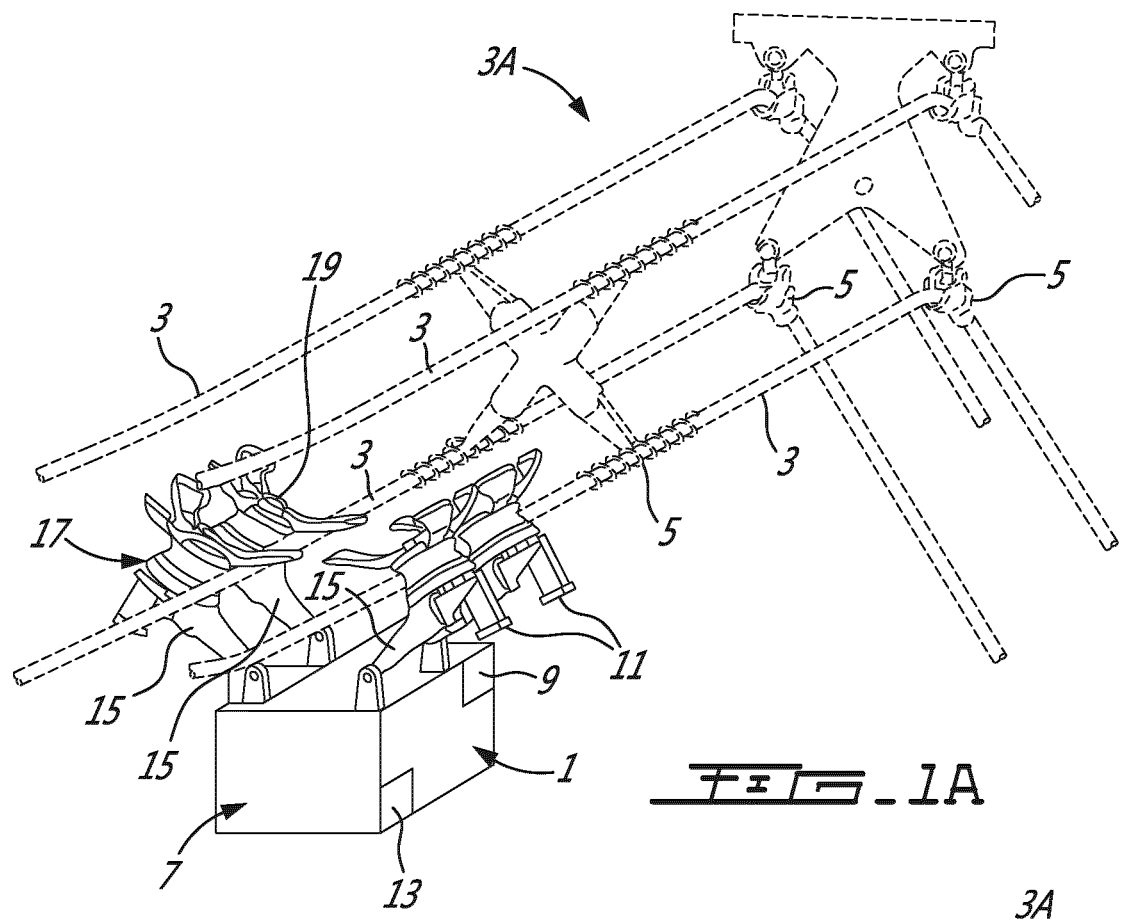
FIG. 1A is a schematic view of a vehicle displaceable along aerial conductors of an electricity transmission line, according to an embodiment of the present disclosure.

FIGS. 1A to 2B show a vehicle 1 mounted on aerial conductor cables 3 of an electricity transmission line 3A. The vehicle 1 is displaceable along the conductors 3, and is able to pass over or by one or more obstacles 5 on the conductors 3. The aerial electrical conductors 3 on which the vehicle 1 travels may or may not be connected to electrical power and carry a current. In FIGS. 1A and 1B, the transmission line 3A includes a quadruple bundle of conductors 3, such as those used on the lines at 735 kV. It will however be appreciated that the vehicle 1 can be used on other types of configuration circuits, either for a single conductor 3, or for bundles of two, three, four or six conductors 3.

The vehicle 1 includes a body 7 that houses or supports components of the vehicle 1. For example, an inspection system 9 is mounted to the body 7 for inspecting the conductors 3, obstacles 5, or other components of the transmission line 3A. A remote control system 13 is also mounted to the body 7 for controlling the inspection system 9 and the displacement of the vehicle 1. In the depicted embodiment, the vehicle 1 is operated in a remote or autonomous manner over a large distance.

The vehicle 1 is supported from the conductors 3 by two or more carrying arms 15 positioned on opposite sides of the body 7. In the depicted embodiment, there are four arms 3 extending from the body 7, but more or fewer arms 15 are possible. Each arm 15 and its components engage one of the conductors 3, and partially supports the weight of the vehicle 1 therefrom. Each arm 15 is pivotally attached to the body 7 and exerts a pressure in the direction of the corresponding conductor 3 for suspending the body 7 onto the conductor 3, as explained in greater detail below. Each arm has a first end 15A that is pivotably mounted to the body 7, and a second distal end 15B that is away from the body 7.

The vehicle 1 also has motorized wheels 17. Each wheel 17 is attached to the distal end 15B of each arm 15 to allow the vehicle 1 to travel along the corresponding conductor 3 while maintaining the vehicle 1 suspended therefrom. In the depicted embodiment, four drive wheels 17 are positioned in two pairs, therefore forming a front axle and rear axle. Each wheel 17 has an axis of rotation 17A that is inclined with respect to the vertical when the wheel 17 engages the conductor 3. In the depicted embodiment, each wheel 17 has a traction motor 17B to rotate the wheel 17 and drive it along the conductor 3. In an alternate embodiment, the body 7 houses a central motor which mechanically engages the wheels 17 to rotate them. It will therefore be appreciated that the term "motorized" refers to any mechanical actuation of the wheels 17, and the configuration of said mechanical actuation is not limited to the configurations shown or described. The wheels 17 are held or applied against the conductors 3 in an inclined manner with respect to a vertical axis. The wheels 17 may be a drive wheel in order to provide traction on the conductors 3, or they may be a passive pressure wheel 17.

Figure 2A:
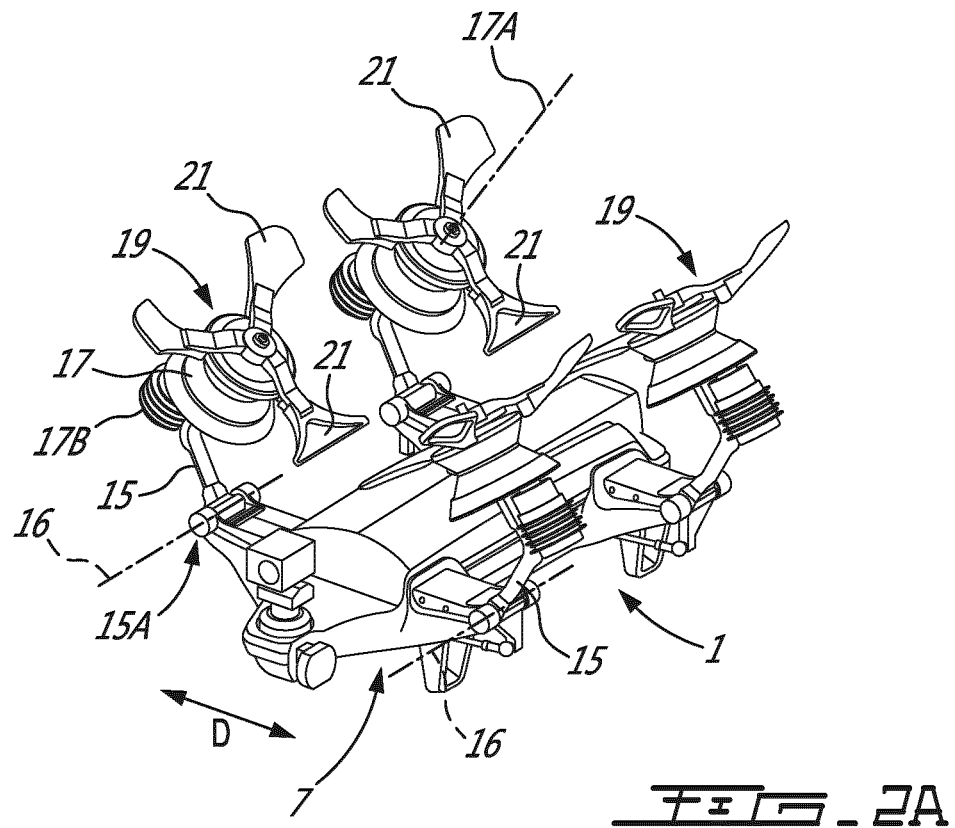
FIG. 2A is a schematic perspective view of the vehicle of FIG. 1A.
Figure 2B:
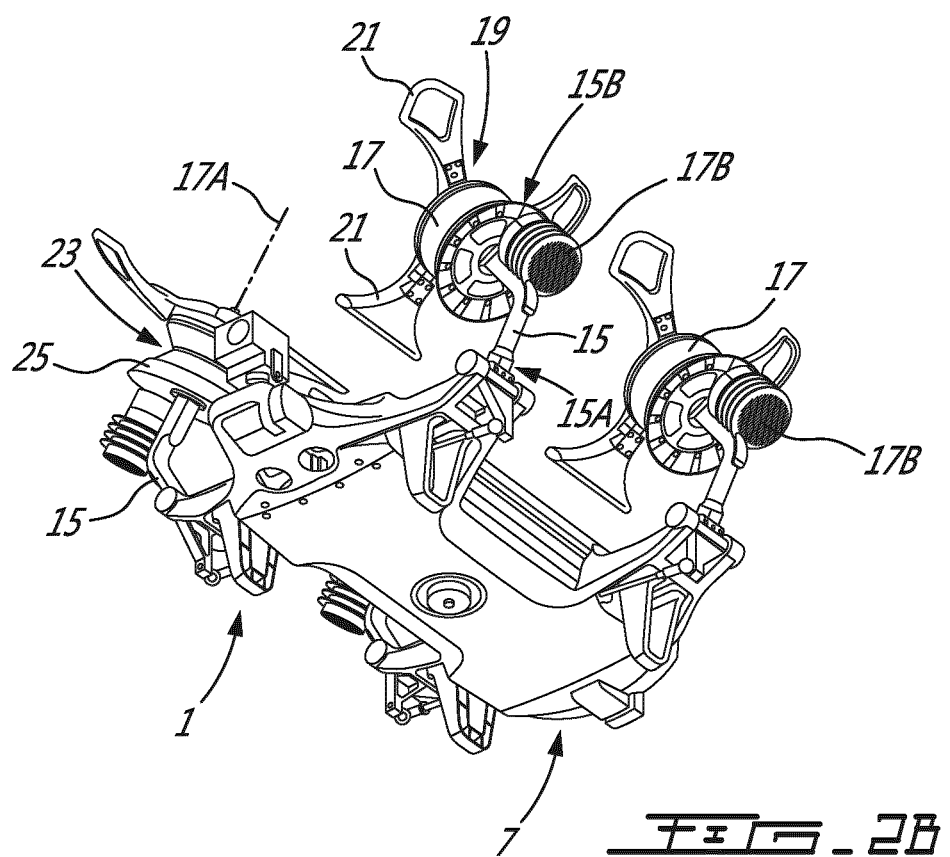
FIG. 2B is another schematic perspective view of the vehicle of FIG. 1A.

Referring to FIGS. 2A and 2B, the shape of the wheels 17 allows accommodating different diameters of conductors 3 by way of a profile having a central groove 23. The wheels 17 may be made of rubber of low hardness in order to maximize the friction coefficient and performance on a humid conductor. The wheels 17 may also be made of polyurethane. A metallic additive may be incorporated in the rubber in order to increase the electrical conductivity of the vehicle 1. An external edge 25 of the wheels 17 may be rounded or flat and made of plastic material so as to provide minimal traction on the obstacles that are passed over for ensuring that the conductor 3 slides and comes back to its position in the middle of the central groove 23 once the obstacle 5 is passed.

The vehicle 1 further includes multiple support rotors 19 which help to support the vehicle 1 when it passes over one of the obstacles 5. The support rotors 19 in the depicted embodiment are not configured to permanently support the vehicle 1 from the conductors 3, and are instead intended to temporarily support the vehicle 1 while it is displacing over one of the obstacles 5. In the embodiment of FIGS. 1A to 2B, the support rotors 19 are coaxially mounted with the wheels 17, and thus rotate about the axis of rotation 17A of the corresponding wheel 17. In alternate embodiments, the support rotors 19 are mounted elsewhere on the body 7, and rotate about a different axis of rotation. For example, the support rotors 19 may be mounted directly on one of the arms 15 and not on the wheels 17. In another embodiment, the support rotor 19 is mounted separately and directly on the body 7 without being mounted on a wheel 17 or on an arm 15. In yet another embodiment, the support rotor 19 is mounted on a carrying arm that is not provided with a wheel 17 and functions substantially in the same way as explained above.

Each of the support rotors 19 has two or more blades 21 that rotate with the support rotor 19 about its axis of rotation. In the depicted embodiment, each support rotor 19 has three blades 21. It is possible to have fewer or more blades 21. When the vehicle 1 is supported by the conductors 3, the blades 21 are positioned above their corresponding conductor 3 in order to temporarily support the vehicle 1 from the corresponding conductor 3 when one of the wheels 17 encounters the obstacle 5, as explained in greater detail below. The blades 21 are therefore dimensioned correspondingly with the obstacles 5. The blades 21, and the support rotor 19 to which they are mounted, rotate when one of the blades 21 contacts or abuts against one of the obstacles 5. In the depicted embodiment, neither the support rotors 19 or the blades 21 are motorized, and thus they are rotated only upon impacting one of obstacles 5. In an alternate embodiment, one or more of the support rotors 19 is motorized, and is commanded to rotate upon approaching or contacting one of the obstacles 5.

Figure 1B:
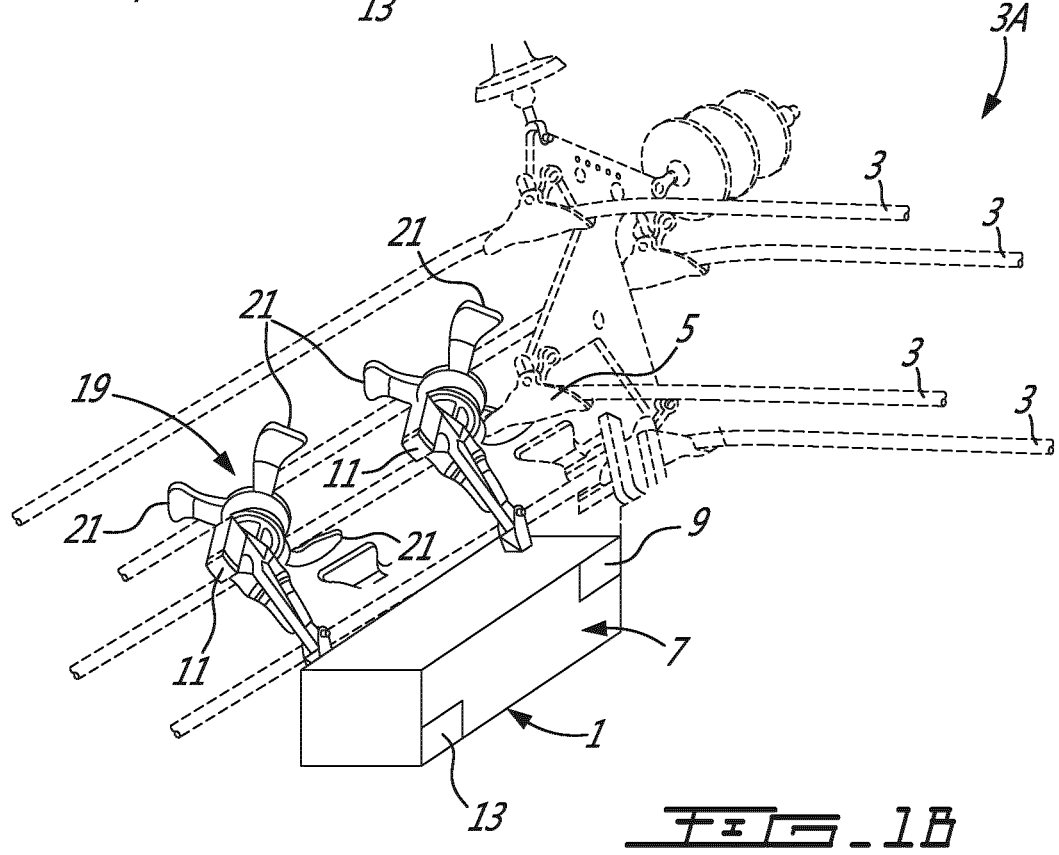
FIG. 1B is another schematic view of the vehicle and conductors of FIG. 1A.

Referring to FIGS. 1A and 1B, in use, when the vehicle 1 travels on the two lower conductors 3 and one of the wheels 17 encounters the obstacle 5, one of the blades 21 will also encounter the obstacle 5. The remaining wheels 17 continue to displace the vehicle 1 along the conductors 3, and this causes the blade 21 to be rotated by the obstacle 5. The wheel 17 therefore briefly loses contact with the conductor 3 along which it is displaced. The rotating blade 21 in turn causes its support rotor 19 to rotate, so that another one of the blades 21 passes over the obstacle 5 and temporarily rests on the conductor 3 and/or the obstacle 5 and supports the vehicle 1 to prevent the vehicle 1 from falling. The blades 21 will also help the wheel 17 to regain contact with the conductor 3 once the obstacle 5 has been passed over by the vehicle 1. Once the wheel 17 regains contact with the conductor 3, the blades 21 no longer contact the conductor 3 and no longer support the vehicle 1 from the conductor 3.

It will therefore be appreciated that the vehicle 1 is able to pass over, in an autonomous and reliable manner, the obstacles 5 that are present on the conductors 3. These obstacles 5 may include, but are not limited to, vibration dampers of different types, spacers in the case of conductor bundles and suspension elements (clamps and insulator strings) that are present on each pylon and that are used to support the one or more conductors 3. The vehicle 1 can therefore be used to transport in a remote-controlled and/or autonomous manner a multitude of sensors used for the inspection and for the maintenance of line components (cameras, measurement instruments, LiDAR, corrosion sensors, etc.) and on several spans, thereby covering a large distance. In this regard, reference is made to U.S. Pat. No. 7,634,966 B2, the entire contents of which are incorporated by reference herein.

Figure 3:
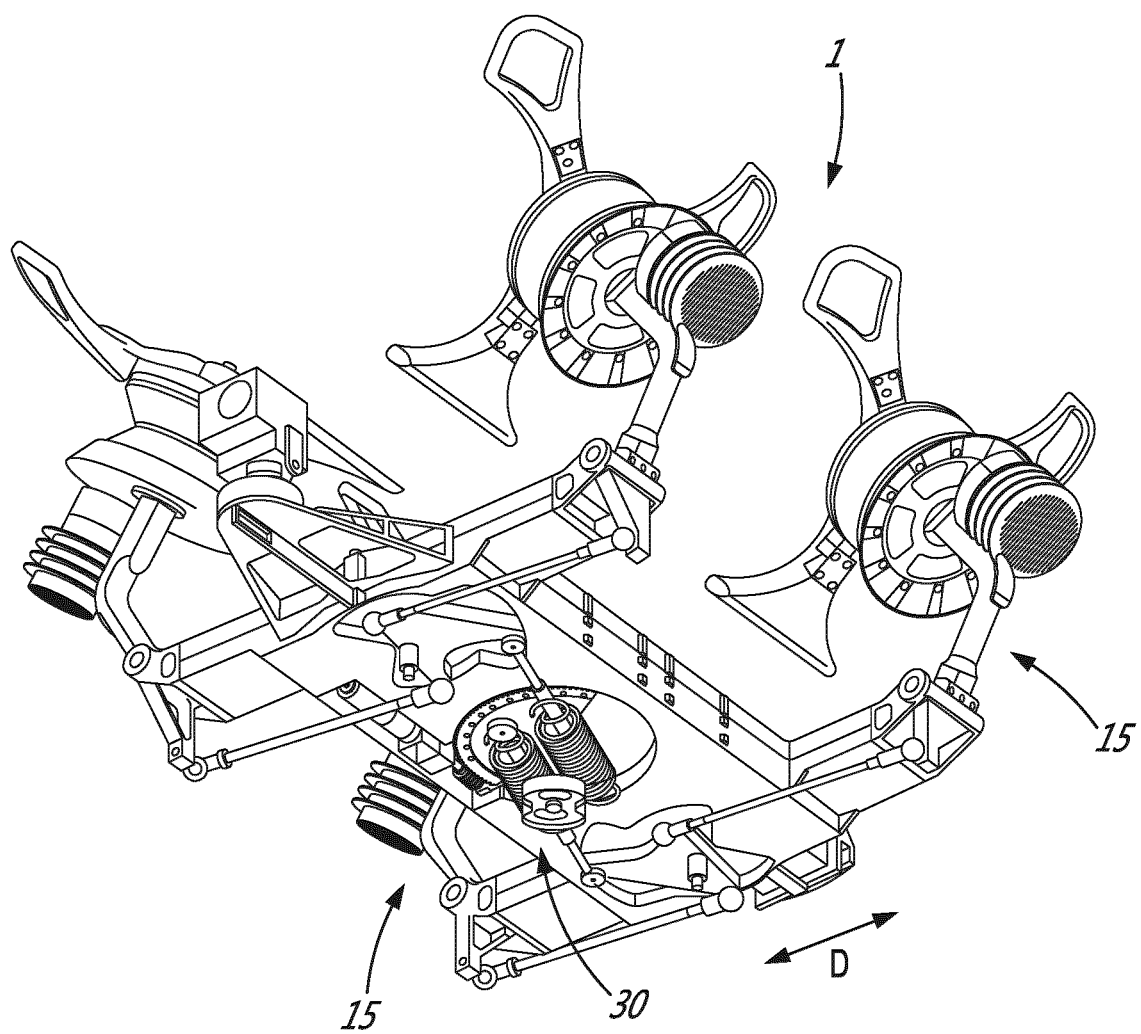
FIG. 3 is a schematic perspective view of the vehicle of FIG. 1A, a portion of a body of the vehicle being removed to show an interior thereof.

Referring to FIGS. 3 to 4B, the vehicle 1 also has an arm displacement mechanism 30. The arm displacement mechanism 30 operates to displace the arms 15 in a pair of arms 15 toward and away from each other. More particularly, the arm displacement mechanism 30 displaces the arms in a direction D that is transverse to the direction of travel of the vehicle 1 along the conductors 3. In the depicted embodiment, the arm displacement mechanism 30 rotates the arms 15 about an axis 16 in order to apply a force in the direction D. In most instances, the direction D is transverse to the direction along which the conductors 3 extend. When opposed arms 15 are rotated about the axis 16 and the wheels are displaced in direction D towards each other, the arms 15 apply a lateral or transverse contact force that is transferred to the wheels 17 on the conductors 3. This enhances the engagement of the wheels 17 with the conductors 3, thereby improving the traction of the wheels 17 and the stability of their grip on the conductors 3. This allows the wheels 17 to support the vehicle 1 from the conductors 3. When the arms 15 are rotated about the axis 16 away from one another, the arms 15 are "opened up", such that the wheels 17 can disengage from the conductors 3 and the vehicle 1 can be removed therefrom, or mounted thereto. It will therefore be appreciated that the arm displacement mechanism 30 operates to both securely mount the vehicle 1 to the conductors 3 for displacement therealong, and to remove the vehicle 1 from the conductors 3.

The arm displacement mechanism 30 helps to control the tensioning elements acting against the arms 15, and thereby helps to generate and adjust the contact force exerted by the wheels 17 against the conductors 3. In the embodiment of FIGS. 4A and 4B, the arm displacement mechanism 30 has a motor 31 that operates to rotate or turn an endless screw or worm 32. The worm 32 engages a worm gear 33 and causes it to turn about a first pivot point 34. Actuating rods 35 are attached at one of their ends to a mount 36 on the worm gear 33, and are attached at the other of their ends to a mount 37 on synchronisation members 38. More particularly, the actuating rod 35 has an inner component 35A attached to the mount 37, and an outer component 35B attached to the mount 36 that is slidable over the inner component 35A. Biasing members 35C are mounted about the outer components 35B of the actuating rods 35. The biasing members 35C are springs in the depicted embodiment. Each biasing member 35C is attached at one of its ends to the mount 36, and is attached at the other of its ends to the mount 37. The synchronisation members 38 act similarly to cams and help to coordinate the movement of opposed arms 15 along the direction D. The synchronisation members 38 turn about a second pivot point 39. Displacement rods 40 are mounted to the synchronisation members 38 at one of their ends, and are also mounted to a corresponding one of the arms 15 of the vehicle 1. Each arm 15 has a pivot bracket 15C which engages the displacement arm 40. The pivot bracket 15C transfers the force of the displacement arm 40 to the arm 15 of the vehicle 1, and ultimately, to the conductors 3 via the wheels 17.

In order to draw opposed arms 15 together along direction D by rotating the arms 15 about the axis 16, the motor 31 rotates the worm 32 to cause the worm gear 33 to turn in a direction G1 about the first pivot point 34. This displaces the mount 36, and thus one end of the biasing members 35C, away from the synchronisation members 38, causing the biasing members 35C to extend and exert a force on the synchronisation members 38. The force on the synchronisation members 38 causes them to turn about the second pivot point 39, which in turn pushes the displacement rods 40 outwardly from the body 7. The outward movement of the displacement rods 40 is translated, via the pivot bracket 15C, into a rotational movement of the arms 15 about the axis 16, which pushes the wheels 17 inwardly toward the body 7 and against the conductors 3. Therefore, the force of the motor 31 is transferred to the arms 15, and ultimately to the wheels 17, to increase their contact force against the conductors 3. The contact force applied by the wheels 17 against the conductors 3 is, in the depicted embodiment, substantially aligned with the plane in which the wheels 17 rotate, where the plane is normal to the axis of rotation 17A.

In order to move opposed arms 15 away from each other along direction D by rotating the arms 15 about the axis 16, the motor 31 rotates the worm 32 to cause the worm gear 33 to turn in a direction G2 about the first pivot point 34. This displaces the mount 36 and the biasing members 35C toward the synchronisation members 38, causing the outer component 35B of the actuating rod 35 to slide over the inner component 35A. When the inner and outer components 35A, 35B enter into contact, the biasing members 35C no longer generate force, and the actuating rods 35 exert a force on the synchronisation members 38. The force on the synchronisation members 38 causes them to turn about the second pivot point 39, which in turn draws the displacement rods 40 inwardly on the body 7. The inward movement of the displacement rods 40 is translated, via the pivot bracket 15C, into a rotational movement of the arms 15 about the axis 16 which moves the wheels 17 away from the body 7 and away from the conductors 3. Therefore, the motor 31 is used to remove the wheels 17 from contact with the conductors 3.

In the depicted embodiment, the movement of the arms 15 is not always controlled by the motor 31 of the arm displacement mechanism 30. When the motor 31 operates to draw opposed arms 15 together so that their wheels 17 engage the conductors 3, the arms 15 are displaced together and in synchronization by the movement of the worm gear 33, as described above. However, sometimes an external force, such as the force exerted by the conductor 3 on the wheel 17 engaged therewith, causes the corresponding opposed arms 15 to move independently of the worm gear 33. The force exerted by the conductor 3 on the wheel 15 causes the corresponding biasing member 35C to extend or elongate past its default elongated position. The force exerted by the conductors 3 also causes the synchronization members 38, the connecting rods 40, and the arms 15 to move accordingly, without resulting in a movement of the worm gear 33 or mount 36. Therefore, when a force is applied by the conductors 3 on the wheel 17, the rotation of the worm gear 33 is not related to the movement of the arms 15. Each opposed pairing of arms 15 is capable of this independent movement, so that non-synchronous movement of all the arms 15 is possible, which can occur when an obstacle 5 is being crossed.

Stated differently, the movement of an opposed pair of the arms 15 is directly related to the movement of the worm gear 33 when the arms 15 are pivoted to apply their wheels 17 against the conductors 3, but the movement of the pair of arms 15 occurs independently of the movement of the worm gear 33 when the wheels 17 are resting on the conductors 17. The motor 31 is thus used to adjust the tension of the biasing members 35C and move the pair of arms 15 when applying the wheels 17 to the conductors 3. Once the wheels 17 are supported by the conductors 3, the motor 31 is no longer used to control the movement of the arms 15. The fact that the arms 15 can be moved independently of the worm gear 33 helps the wheels 17 to bypass the obstacles 5 in a more autonomous fashion, and allow a more passive operation of the wheels 17. In some configurations, the movement of the pair of arms 15 occurs quasi-independently from the movement of the worm gear 33 when the wheels 17 are supported by the conductors 3 because, if the vehicle 1 is at a location where the rigidity of the conductors 3 is low, the force exerted by the wheels on the conductors 3 will cause the conductors 3 to move closer together towards an equilibrium between their rigidity and the tension created by the biasing members 35C. In addition, and if needed, the motor 31 may be used to adjust the contact force applied by the wheels 17 against the conductors 3.

Referring to FIGS. 5A to 5E, each blade 21 has an arm portion 22 that extends radially outwardly from its support rotor 19 and is rotatable therewith. Each blade 21 also has a contact portion 24 that extends from the arm portion 22. The contact portion 24 is the segment of the blade 21 which engages with the conductor 3 to temporarily support the vehicle 1. In the depicted embodiment, the contact portion 24 is separate from the arm portion 22 of each blade 21, and is attached thereto with mechanical fasteners. In an alternate embodiment, each blade 21 is a unitary piece, and the arm and contact portions 22, 24 are integral with one another.

One of the blades 21 of each support rotor 19 is an "impact" or "central" blade 21A that is configured to contact the obstacle 5 first, and thus before the other blades 21. The remaining blades 21 are "transition" blades 21B which contact the conductor 3 after the impact blade 21A has been rotated out of the way. The transition blades 21B help to support the vehicle 1 when it is transitioning over or past the obstacles 5. In the depicted embodiment, the support rotor 19 has one impact blade 21A and two transition blades 21B. The impact and transition blades 21A, 21B of each support rotor 19 are different from one another in the depicted embodiment. More particularly, the contact portion 24A of the impact blade 21A has a shape that is different from a shape of the contact portion 24B of the transition blades 21B. By "shape" it is understood that the form, outline, or appearance of the contact portions 24 of the impact and transition blades 21A, 21B are different from one another. This difference can be expressed in different ways. In an alternate embodiment, the shape of the contact portion of the impact blades may be identical to the shape of the contact portion of the transition blades.

For example, and referring to FIG. 5D, the area of the contact portions 24 of the impact and transition blades 21A, 21B is different. The contact portion 24A of the impact blade 21A has a first surface area, and the contact portion 24B of the transition blades 21B has a second surface area. The first surface area is greater than the second surface area. The larger impact blade 21A may help to provide more time for the transition blades 21B to engage the conductor 3 when the wheel 17 encounters and bypasses the obstacle 5. In another example, and still referring to FIG. 5D, a peripheral edge 26 of the contact portions 24 of the impact and transition blades 21A, 21B is different. The peripheral edge 26A of the contact portion 24A of the impact blade 21A has a first curvature, which in the depicted embodiment, is substantially zero. Stated differently, the peripheral edge 26A of the impact blade 21A is substantially linear. The peripheral edge 26B of the contact portion 24B of the transition blades 21B has a second curvature that is greater than the first curvature. In the depicted embodiment, the peripheral edges 26B of the transition blades 21B form a pointier end than the peripheral edge 26A of the impact blade 21A. This difference in shape may help the transition blades 21B to better go around the obstacle 5 which, depending on the obstacle 5, may enter in contact with the obstacle 5 before the wheels 17 roll along the obstacle 5 and distance the peripheral edge 26B of the contact portion 24B from the obstacle 5. The geometry of the contact portion 24B may allow the support rotor 19 to bypass the obstacle 5 if it contacts the obstacle 5, instead of blocking the rotation of the support rotor 19.

Referring to FIGS. 5B and 5C, a plane P is defined normal to the axis of rotation 17A of the wheels 17. The plane P can be at any point along the axis of rotation 17A. The contact portion 24A of the impact blade 21A is substantially parallel to the plane P, as shown in FIG. 5C. By "substantially parallel", it is understood that most or all of the extent of the contact portion 24A is parallel to the plane P. By being in the plane P that is parallel to the plane of rotation of the wheels 17, the contact portion 24A may help to position and maintain the transition blades 21B above the height of the conductors 3. The contact portions 24B of the transition blades 21B are transverse or non-parallel to the plane P. More particularly, and as shown in FIG. 5B, the contact portion 24B of the transition blades 21B forms an angle $\theta$ with the plane. The angle $\theta$ is about 25° in the depicted embodiment. Other values for the angle $\theta$ are possible. The transition blades 21B may be better able to remain positioned above the conductors 3 and thus better able to relieve the impact blade 21A by forming the angle $\theta$ with the plane P. In some instances, if the angle $\theta$ is too small, the support rotor 19 may not be able to return the wheel 17 onto the conductor 3 and the wheel 17 may pass underneath the conductor 3 which may block movement of the vehicle 1 along the conductor 3, or may cause the vehicle 1 to fall.

Still referring to FIG. 5B, the contact portion 24B of the transition blades 21B has a base edge 28. The base edge 28 is the edge or segment of the contact portion 24B in proximity to the wheel 17. In the depicted embodiment, the distance separating the base edge 28 from the rounded edge 25 of the wheel 17 is minimized, such that the base edge 28 is as close as possible to the wheel 17. This proximity of the base edge 28 to the wheel 17 may help to better position the transition blades 21B above the conductors 3, and to avoid a small object such as a broken strand of the conductor 3 from blocking rotation of the support rotor 19.

Referring to FIG. 5D, a circumferential or angular angle of separation $\alpha$ is defined between each of the transition blades 21B and the impact blade 21A. The angle of separation $\alpha$ is between about 125° and about 135°. For some configurations of the vehicle 1, if the angle of separation $\alpha$ is above this range, the transition blades 21B may not position themselves correctly once they bypass the obstacle 1. If the angle of separation $\alpha$ is below this range, the transition blades 21B may abut against certain obstacles 5 and thus prevent the vehicle 1 from advancing along the conductors 3.

In the depicted embodiment, the impact blade 21A is configured to have a default position over one of the conductors 3. Therefore, when the vehicle 1 is travelling along the conductors 3 between obstacles 5, the impact blade 21A will be positioned over the conductors 3 to impact the next obstacle 5 before the transition blades 21B. In this regard, and as shown in FIG. 5E, the impact blade 21A has a roller 29 mounted to an underside of the arm portion 22A, at the intersection of the arm portion 22A and the contact portion 24A.

The roller 29 is configured to engage with one of the conductors 3 when the vehicle 1 is travelling. The roller 29 may not always be in contact with the conductors 3. The roller 29 helps the support rotors 19 to maintain their orientation (i.e. such that the impact blade 21A is the first blade 21 to engage the obstacle 5) in the event that the impact blade 21A contacts the conductor 3 during displacement of the vehicle 1 between obstacles 5. Stated differently, the roller 29 helps the impact blade 21A to slide along the conductor 3 in the event of contact when the vehicle 1 is travelling, rather than being rotated by the conductor 3. This helps to maintain the support rotors 19 in the orientation desired to confront the obstacles 5.

To help the support rotors 19 to maintain the desired orientation, they may be equipped with an indexation or return system. For example, a passive indexation position system or a return spring may be used to maintain a reference position of the support rotor 19 and the blades 21 when approaching the obstacles 5, and to ensure that the support rotor 19 and blades 21 return to the reference position or to an equivalent position once the obstacle 5 is passed over.

The vehicle 1 disclosed herein can, in at least some embodiments, overcome obstacles 5 of different shapes (e.g. suspension clamps, spacers, etc.) in a relatively short time (a few seconds), on conductors 3 of varying rigidity and tension, in different bundle configurations, and on conductors 3 that have a relatively steep grade or slope. This versatility makes it possible for the vehicle 1 to inspect or monitor many kilometers of conductors 3 in a single day.

In at least one embodiment of the vehicle 1, the vehicle 1 can travel along conductors 3 with a slope of up to 35°, or conductors 3 tensioned up to 25° between obstacles 5, and can travel past obstacles 5 on conductors 3 having a slope up to 25°. The vehicle 1 may also be able to change direction following an obstacle 5, where the maximum change in direction may be 12° from the direction of travel.

Reference is made to U.S. Pat. No. 7,634,966 B2, the entire contents of which are incorporated by reference herein.

The embodiments described herein include:

A. A vehicle displaceable along aerial conductors of an electricity transmission line, the vehicle comprising: a body having at least one pair of arms, the arms of the at least one pair of arms being mounted on opposite sides of the body and extending away therefrom, each arm having a first end pivotably mounted to the body and a second distal end, a motorized wheel being mounted to the distal end of each arm, each wheel being engageable with one of the conductors to displace the vehicle therealong; a plurality of support rotors each mounted with one of the wheels and provided with at least two blades, each blade having an arm portion extending from the support rotor and being rotatable therewith, and a contact portion extending from the arm portion to engage one of the conductors to temporarily support the vehicle with the contact portion, the at least two blades including an impact blade and at least one transition blade; and an arm displacement mechanism mounted to the body and engaged with the arms, the arm displacement mechanism operable to displace the arms of the at least one pair of arms in a direction transverse to a direction of travel of the vehicle to move the opposed arms of the at least one pair of arms together, and to move the opposed arms of the at least one pair of arms apart.

The embodiment A may have one or more of the following elements in any combination.

Element 1: the contact portion of the impact blade has a first surface area and the contact portion of the at least one transition blade has a second surface area, the first surface area being greater than the second surface area. Element 2: the contact portion of each blade has a peripheral edge, the peripheral edge of the contact portion of the impact blade having a first curvature, and the peripheral edge of the contact portion of the at least one transition blade having a second curvature being greater than the first curvature. Element 3: the wheels are rotatable about a wheel axis, a plane being defined normal to the wheel axis, the contact portion of the impact blade being substantially parallel to the plane, and the contact portion of the at least one transition blade being transverse to the plane. Element 4: the contact portion of the at least one transition blade forms an angle with the plane, the angle being about 25°.

Element 5: the wheel axis is inclined with respect to the vertical. Element 6: wherein an angle of separation is defined between each of the at least one transition blade and the impact blade, the angle of separation being between 125° and 135°. Element 7: wherein the impact blade is configured to have a default position over one of the conductors. Element 8: the impact blade has a roller mounted to one of the arm portion and the contact portion, the roller being engageable with one of the conductors. Element 9: the arm displacement mechanism includes a motor, a gear engaged to the motor and rotatable about a first pivot point, and at least two displacement rods, each of the at least two displacement rods having a first end mounted to a corresponding arm of the body and a second end mounted to the gear, the motor being operable to rotate the gear to displace the at least two displacement rods and the wheels inwardly or outwardly along the direction transverse to the direction of travel. Element 10: the arm displacement mechanism includes at least one actuating rod and at least one synchronization member rotatable about a second pivot point, the at least one actuating rod having an end attached to a first mount on the gear and another end attached to a second mount on the at least one synchronization member, the second ends of the at least two displacement rods being attached to mounts on the at least one synchronization member, the second ends of the at least two displacement rods being engaged with the gear via the at least one actuating rod and the at least one synchronization member. Element 11: the actuating rod includes an inner component mounted to one of the first and second mounts and an outer component mounted to the other of the first and second mounts, the outer component being slidable over the inner component, a biasing member having a first end attached to the first mount and a second end attached to the second mount, the biasing member configured to exert a force to draw the first and second mounts together. Element 12: the biasing member is a spring mounted about the outer component of the actuating rod. Element 13: the motorized wheel has a traction motor to rotate the wheel. Element 14: the wheel includes a central groove to receive one of the conductors. Element 15: the wheel is made of rubber or polyurethane.

Element 16: a metallic additive is integral with the wheel. Element 17: each of the plurality of support rotors is mounted coaxially with a corresponding wheel. Element 18: each of the support rotors has at least three blades, the at least three blades including two impact blades and at least one transition blade. Element 19: the contact portion of the impact blade has a shape different from a shape of the contact portion of the at least one transition blade.

B. A method for displacing a vehicle along aerial conductors of an electricity transmission line, the method comprising: rotating at least two wheels each in contact with one of the aerial conductors to induce movement of a body of the vehicle along the aerial conductors, each of the at least two wheels mounted at a distal end of an arm mounted at its other end to the body of the vehicle; applying a force on the arms in a direction transverse to a direction of movement of the vehicle along the aerial conductors to displace the arms toward each other; and when one of the at least two wheels encounter an obstacle of the aerial conductor, advance the vehicle in a direction of the obstacle to: contact the obstacle with an impact blade of a support rotor mounted to one of the at least two wheels; and rotate the support rotor about the obstacle with the impact blade by advancing the vehicle, so as to temporarily distance one of the at least two wheels from the aerial conductor, advancement of the vehicle along the aerial conductors after the obstacle causing one of the at least two wheels to reengage the aerial conductor.

The embodiment B may have one or more of the following elements in any combination.

Element 20: rotating the at least two wheels includes rotating at least two motors each engaged to one of the at least two wheels. Element 21: rotating the at least two wheels includes rotating each of the at least two wheels about a wheel axis, the wheel axis being inclined with respect to the vertical. Element 22: pulling on the arms in the direction transverse to the direction of movement of the vehicle includes displacing the arms toward or away from the body of the vehicle in a symmetric manner. Element 23: contacting the obstacle with the impact blade includes returning the impact blade to a default position after having passed the obstacle.

C. A method of installing a vehicle on aerial conductors, comprising: receiving two aerial conductors between at least two motorized wheels mounted to distal ends of arms of at least one pair of arms, the arms of the at least one pair pivotably mounted at proximal ends to a body of the vehicle; pivoting the arms of the at least one pair of arms toward each other until the at least two motorized wheels contact the aerial conductors to support a weight of the vehicle from the aerial conductors with the motorized wheels.

The embodiment C may have one or more of the following elements in any combination.

Element 30: receiving the two aerial conductors includes distancing the two motorized wheels from the body of the vehicle before receiving the two aerial conductors. Element 31: pivoting the arms includes pushing the arms with displacement rods, each displacement rod having a first end mounted to one of the arms and a second end engaged with a gear rotatable about a first pivot point, pivoting the arms includes rotating the gear. Element 32: rotating the gear includes driving a motor engaged with the gear. Element 33: the second end of each displacement rod is mounted to a first mount on a synchronization member being rotatable about a second pivot point, rotating the gear includes rotating the synchronization member with an actuating rod having a first end mounted to a second mount on the synchronization member and having a second end mounted to a mount on the gear.

The above description is meant to be exemplary only, and one skilled in the art will recognize that changes may be made to the embodiments described without departing from the scope of the invention disclosed. Still other modifications which fall within the scope of the present invention will be apparent to those skilled in the art, in light of a review of this disclosure, and such modifications are intended to fall within the appended claims.

The invention claimed is:

1. A vehicle displaceable along aerial conductors of an electricity transmission line, the vehicle comprising:

a body having at least one pair of arms, the arms of the at least one pair of arms being mounted on opposite sides of the body and movable part from one another, each said arm having a first end pivotably mounted to the body and a second distal end, a wheel being mounted to the distal end of each said arm, each said wheel being engageable with one of the conductors to displace the vehicle therealong, at least one of the arms being motorized;

a plurality of support rotors each mounted with one of the wheels and provided with at least two blades, each said blade having an arm portion extending from the support rotor and being rotatable therewith, and a contact portion extending from the arm portion to engage one of the conductors to temporarily support the vehicle with the contact portion; and an arm displacement mechanism mounted to the body and engaged with the arms, the arm displacement mechanism operable to displace the arms of the at least one pair of arms to move the opposed arms of the at least one pair of arms towards one another, and to move the opposed arms of the at least one pair of arms away from one another.

2. The vehicle of claim 1, wherein the at least two blades including an impact blade and at least one transition blade, the contact portion of the impact blade has a shape different from a shape of the contact portion of the at least one transition blade.

3. The vehicle of claim 2, wherein the contact portion of the impact blade has a first surface area and the contact portion of the at least one transition blade has a second surface area, the first surface area being greater than the second surface area.

4. The vehicle of claim 2, wherein the contact portion of each blade has a peripheral edge, the peripheral edge of the contact portion of the impact blade having a first curvature, and the peripheral edge of the contact portion of the at least one transition blade having a second curvature being greater than the first curvature.

5. The vehicle of claim 2, wherein the wheels are rotatable about a wheel axis, a plane being defined normal to the wheel axis, the contact portion of the impact blade being substantially parallel to the plane, and the contact portion of the at least one transition blade being transverse to the plane.

6. The vehicle of claim 5, wherein the contact portion of the at least one transition blade forms an angle with the plane, the angle being about 25°.

7. The vehicle of claim 5, wherein the wheel axis is inclined with respect to the vertical.

8. The vehicle of claim 2, wherein an angle of separation is defined between each of the at least one transition blade and the impact blade, the angle of separation being between 125° and 135°.

9. The vehicle of claim 1, wherein the impact blade is configured to have a default position over one of the conductors.

10. The vehicle of claim 2, wherein the impact blade has a roller mounted to one of the arm portion and the contact portion, the roller being engageable with one of the conductors.

11. The vehicle of claim 1, wherein the arm displacement mechanism includes a motor, a gear engaged to the motor and rotatable about a first pivot point, and at least two displacement rods, each of the at least two displacement rods having a first end mounted to a corresponding said arm of the body and a second end mounted to the gear, the motor being operable to rotate the gear to displace the at least two displacement rods and the wheels inwardly or outwardly along the direction transverse to the direction of travel.

12. The vehicle of claim 11, wherein the arm displacement mechanism includes at least one actuating rod and at least one synchronization member rotatable about a second pivot point, the at least one actuating rod having an end attached to a first mount on the gear and another end attached to a second mount on the at least one synchronization member, the second ends of the at least two displacement rods being attached to mounts on the at least one synchronization member, the second ends of the at least two displacement rods being engaged with the gear via the at least one actuating rod and the at least one synchronization member.

13. The vehicle of claim 12, wherein the actuating rod includes an inner component mounted to one of the first and second mounts and an outer component mounted to the other of the first and second mounts, the outer component being slidable over the inner component, a biasing member having a first end attached to the first mount and a second end attached to the second mount, the biasing member configured to exert a force to draw the first and second mounts together.

14. The vehicle of claim 13, wherein the biasing member is a spring mounted about the outer component of the actuating rod.

15. The vehicle of claim 1, including two of said pair of arms, the arm displacement mechanism having a single motor, the arm displacement mechanism operable to displace the two pairs of arms using the single motor.

16. The vehicle of claim 1, wherein the motorized wheel has a traction motor to rotate the wheel.

17. The vehicle of claim 1, wherein the wheel includes a central groove to receive one of the conductors.

18. The vehicle of claim 1, wherein the wheel is made of rubber or polyurethane.

19. The vehicle of claim 18, wherein a metallic additive is integral with the wheel.

20. The vehicle of claim 1, wherein each of the plurality of support rotors is mounted coaxially with a corresponding wheel.

21. The vehicle of claim 1, wherein each of the support rotors has at least three blades, the at least three blades including two impact blades and at least one transition blade.

22. A vehicle displaceable along aerial conductors of an electricity transmission line, the vehicle comprising:
a body having at least one pair of arms, the arms of the at least one pair of arms being mounted on opposite sides of the body and movable part from one another, each said arm having a first end pivotably mounted to the body and a second distal end, a wheel being mounted to the distal end of each said arm, each said wheel being engageable with one of the conductors to displace the vehicle therealong, at least one of the arms being motorized; and
a plurality of support rotors each mounted with one of the wheels and provided with at least two blades, each said blade having an arm portion extending from the support rotor and being rotatable therewith, and a contact portion extending from the arm portion to engage one of the conductors to temporarily support the vehicle with the contact portion, the at least two blades including an impact blade and at least one transition blade, the contact portion of the impact blade has a shape different from a shape of the contact portion of the at least one transition blade, the one of the wheels being rotatable about a wheel axis, a plane being defined normal to the wheel axis, a first angle defined between the plane and the contact portion of the impact blade different than a second angle defined between the plane and the contact portion of the at least one transition blade.

23. The vehicle of claim 22, wherein the impact blade is substantially parallel to the plane, and the contact portion of the at least one transition blade being transverse to the plane.

24. The vehicle of claim 22, wherein the contact portion of the impact blade has a first surface area and the contact portion of the at least one transition blade has a second surface area, the first surface area being greater than the second surface area.

25. The vehicle of claim 22, wherein the contact portion of each blade has a peripheral edge, the peripheral edge of the contact portion of the impact blade having a first curvature, and the peripheral edge of the contact portion of the at least one transition blade having a second curvature being greater than the first curvature.

* * * * *